US011955608B2

(12) United States Patent
Xie et al.

(10) Patent No.: US 11,955,608 B2
(45) Date of Patent: Apr. 9, 2024

(54) LITHIUM PRECIPITATION DETECTION METHOD FOR BATTERY PACK, COMPUTER-READABLE STORAGE MEDIUM, AND POWER CONSUMING APPARATUS

(71) Applicant: CONTEMPORARY AMPEREX TECHNOLOGY CO., LIMITED, Fujian (CN)

(72) Inventors: Lan Xie, Fujian (CN); Zhen Lin, Fujian (CN); Guangyu Xu, Fujian (CN); Shuai Song, Fujian (CN)

(73) Assignee: CONTEMPORARY AMPEREX TECHNOLOGY CO., LIMITED, Ningde (CN)

( * ) Notice: Subject to any disclaimer, the term of this patent is extended or adjusted under 35 U.S.C. 154(b) by 0 days.

(21) Appl. No.: 18/379,222

(22) Filed: Oct. 12, 2023

(65) Prior Publication Data

US 2024/0039063 A1 Feb. 1, 2024

Related U.S. Application Data

(63) Continuation of application No. PCT/CN2021/130685, filed on Nov. 15, 2021.

(51) Int. Cl.
*H01M 10/42* (2006.01)
*G01R 31/3835* (2019.01)
(Continued)

(52) U.S. Cl.
CPC .... *H01M 10/4285* (2013.01); *G01R 31/3835* (2019.01); *H01M 10/425* (2013.01);
(Continued)

(58) Field of Classification Search
CPC ........... H01M 10/4285; H01M 10/425; H01M 10/441; H01M 10/482; H01M 2010/4271; G01R 31/3835; H02J 7/0068
(Continued)

(56) References Cited

U.S. PATENT DOCUMENTS 10,522,815 B1\* 12/2019 Turney .................. H01M 4/625
2015/0212158 A1\* 7/2015 Takahashi .......... G01R 31/3274
324/424
2021/0351446 A1\* 11/2021 Zhu ....................... H02J 7/0047

FOREIGN PATENT DOCUMENTS

CN 105866695 A 8/2016
CN 108572325 A 9/2018
(Continued)

OTHER PUBLICATIONS

International Search Report and Written Opinion dated May 20, 2022, received for PCT Application PCT/CN2021/130685, filed on Nov. 15, 2021, 13 pages including English Translation.

*Primary Examiner* — Nathaniel R Pelton
(74) *Attorney, Agent, or Firm* — XSENSUS LLP

(57) ABSTRACT

A lithium precipitation detection method may include: sending, when a battery management module in the battery pack determines that a change in a charging voltage of the battery pack meets a predetermined condition, a charging request containing a first current to a charging pile for charging, and controlling the battery pack to be charged with the first current for a first predetermined duration and a second predetermined duration, where the first predetermined duration is equal to the second predetermined duration; obtaining, by the battery management module, a first voltage change amount within the first predetermined duration and a second voltage change amount within the second predetermined duration; and determining, when the battery management module determines that a difference between the
(Continued)

second voltage change amount and the first voltage change amount is greater than a predetermined voltage threshold, that lithium precipitation occurs in the battery pack.

7 Claims, 3 Drawing Sheets

(51) Int. Cl.
    *H01M 10/44*     (2006.01)
    *H01M 10/48*     (2006.01)
    *H02J 7/00*     (2006.01)

(52) U.S. Cl.
    CPC ....... *H01M 10/441* (2013.01); *H01M 10/482* (2013.01); *H02J 7/0068* (2013.01); *H01M 2010/4271* (2013.01)

(58) Field of Classification Search
    USPC .......................................................... 324/432
    See application file for complete search history.

(56) References Cited

FOREIGN PATENT DOCUMENTS

| | | |
|---|---|---|
| CN | 111458642 A | 7/2020 |
| CN | 111796187 A | 10/2020 |
| CN | 112383102 A | 2/2021 |
| CN | 112782599 A | 5/2021 |
| CN | 113075563 A | 7/2021 |
| JP | 2013-057603 A | 3/2013 |

\* cited by examiner

LITHIUM PRECIPITATION DETECTION METHOD FOR BATTERY PACK, COMPUTER-READABLE STORAGE MEDIUM, AND POWER CONSUMING APPARATUS

CROSS-REFERENCE TO RELATED APPLICATION

The present application is a continuation of International Application No. PCT/CN2021/130685, filed Nov. 15, 2021, which is incorporated herein by reference in its entirety.

TECHNICAL FIELD

The present application relates to the field of batteries, and specifically to a lithium precipitation detection method for a battery pack, a computer-readable storage medium, and a power consuming apparatus.

BACKGROUND ART

Achieving energy conservation and emission reduction is the key to the sustainable development of the automotive industry. Electric vehicles have become an important part of the sustainable development of the automotive industry due to their advantages in energy conservation and environmental protection. For the electric vehicles, the battery technology is a key factor to their development.

During a charging process, lithium precipitation may occur in a battery pack. If the lithium precipitation in the battery pack cannot be detected in a timely manner, the safety performance of the battery will be affected.

SUMMARY OF THE DISCLOSURE

In view of the above problems, the present application provides a lithium precipitation detection method for a battery pack, a computer-readable storage medium, and a power consuming apparatus, which can detect lithium precipitation in the battery pack in a timely, simple, and efficient manner without substantially affecting the charging efficiency of the battery pack.

In a first aspect, the present application provides a lithium precipitation detection method for a battery pack, where the battery pack includes a battery management module, and the lithium precipitation detection method includes: sending, when the battery management module determines that a change in a charging voltage of the battery pack meets a predetermined condition, a charging request containing a first current to a charging pile for charging, and controlling the battery pack to be charged with the first current for a first predetermined duration and a second predetermined duration, where the first predetermined duration is equal to the second predetermined duration; obtaining, by the battery management module, a first voltage change amount within the first predetermined duration and a second voltage change amount within the second predetermined duration; and determining, when the battery management module determines that a difference between the second voltage change amount and the first voltage change amount is greater than a predetermined voltage threshold, that lithium precipitation occurs in the battery pack.

In the technical solution of this embodiment of the present application, the applicant found through research that, when the change in the charging voltage of the battery pack meets the predetermined condition, if the battery pack continues to be charged while lithium precipitation occurs in the battery pack, a part of precipitated lithium ions will re-enter an electrolyte, and then re-enter a negative electrode material of the battery pack, resulting in a significant increase in the charging voltage of the battery pack, and the lithium precipitation in the battery pack can be detected more easily at this time in a timely and efficient manner. Further, at this time, the charging with the first current lasts for the two equal predetermined durations, the voltage change amount within one of the two predetermined durations is compared with that within the other, and if the voltage change amount is greater than a specific value, it indicates that lithium precipitation occurs in the battery pack. In this way, according to the technical solution of this embodiment of the present application, lithium precipitation in the battery pack can be detected in a timely, simple, and efficient manner without substantially affecting the charging efficiency of the battery pack, so that further prevention measures can be taken.

In some embodiments, the sending, when the battery management module determines that a change in a charging voltage of the battery pack meets a predetermined condition, a charging request containing a first current to a charging pile for charging, and controlling the battery pack to be charged with the first current for a first predetermined duration and a second predetermined duration includes: when the battery management module determines that a state of charge of the battery pack is within a range of 5%-30% or 50%-60%, sending the charging request containing the first current to the charging pile for charging, and controlling the battery pack to be charged with the first current for the first predetermined duration and the second predetermined duration. In the lithium precipitation detection method of this embodiment of the present application, when the state of charge of the battery pack, especially the battery pack whose negative electrode material is graphite, is within the range of 5%-30% or 50%-60%, a negative electrode voltage of the battery pack significantly decreases, while a battery voltage of the battery pack significantly increases, and whether lithium precipitation occurs in the battery pack can be detected more easily at this time in a timely and efficient manner.

In some embodiments, the sending, when the battery management module determines that a change in a charging voltage of the battery pack meets a predetermined condition, a charging request containing a first current to a charging pile for charging, and controlling the battery pack to be charged with the first current for a first predetermined duration and a second predetermined duration includes: when the battery management module determines that a state of charge of the battery pack meets a predetermined condition, sending a charging request containing a current between 0.1 A and 10 A to the charging pile for charging, and controlling the battery pack to be charged with the current between 0.1 A and 10 A for the first predetermined duration and the second predetermined duration.

In some embodiments, the obtaining, by the battery management module, a first voltage change amount within the first predetermined duration and a second voltage change amount within the second predetermined duration includes: obtaining, by the battery management module, the first voltage change amount within the first predetermined duration and the second voltage change amount within the second predetermined duration, where a value of the first predetermined duration and the second predetermined duration ranges from 1 minute to 15 minutes.

In the lithium precipitation detection method of this embodiment of the present application, the first current is selected within a range of a small current such as 0.1 A-10 A, or a predetermined duration for charging with the small current is selected within a range of 1 minute to 15 minutes. In this way, lithium precipitation in the battery pack can be detected in a timely, simple, and efficient manner without interrupting a normal charging process of the battery pack.

In the lithium precipitation detection method of this embodiment of the present application, the determining, when the battery management module determines that a difference between the second voltage change amount and the first voltage change amount is greater than a predetermined voltage threshold, that lithium precipitation occurs in the battery pack includes: when the battery management module determines that the difference between the second voltage change amount and the first voltage change amount is greater than 5 mV, determining that lithium precipitation occurs in the battery pack. The inventors of the present application have found through in-depth research that 5 mV is an optimal value for determining whether lithium precipitation occurs in the battery pack, and lithium precipitation in the battery pack can be reliably detected based on this.

In a second aspect, there is provided a computer-readable storage medium storing computer instructions, where when the computer instructions are executed, the lithium precipitation detection method according to the above embodiments is performed.

In a third aspect, there is provided a power consuming apparatus, where the power consuming apparatus includes a battery pack, and the battery pack is configured to perform the lithium precipitation detection method according to the above embodiments.

The above description is only an overview of the technical solutions of the present application. In order to more clearly understand the technical means of the present application to implement same according to the contents of the description, and in order to make the above and other objectives, features and advantages of the present application more obvious and understandable, specific implementations of the present application are exemplarily described below.

BRIEF DESCRIPTION OF THE DRAWINGS

Various other advantages and benefits will become apparent to those of ordinary skill in the art upon reading the following detailed description of preferred implementations. Accompanying drawings are merely for the purpose of illustrating the preferred implementations and are not to be construed as limiting the present application. Moreover, like components are denoted by like reference numerals throughout the accompanying drawings. In the drawings.

DETAILED DESCRIPTION OF EMBODIMENTS

Figure 1:
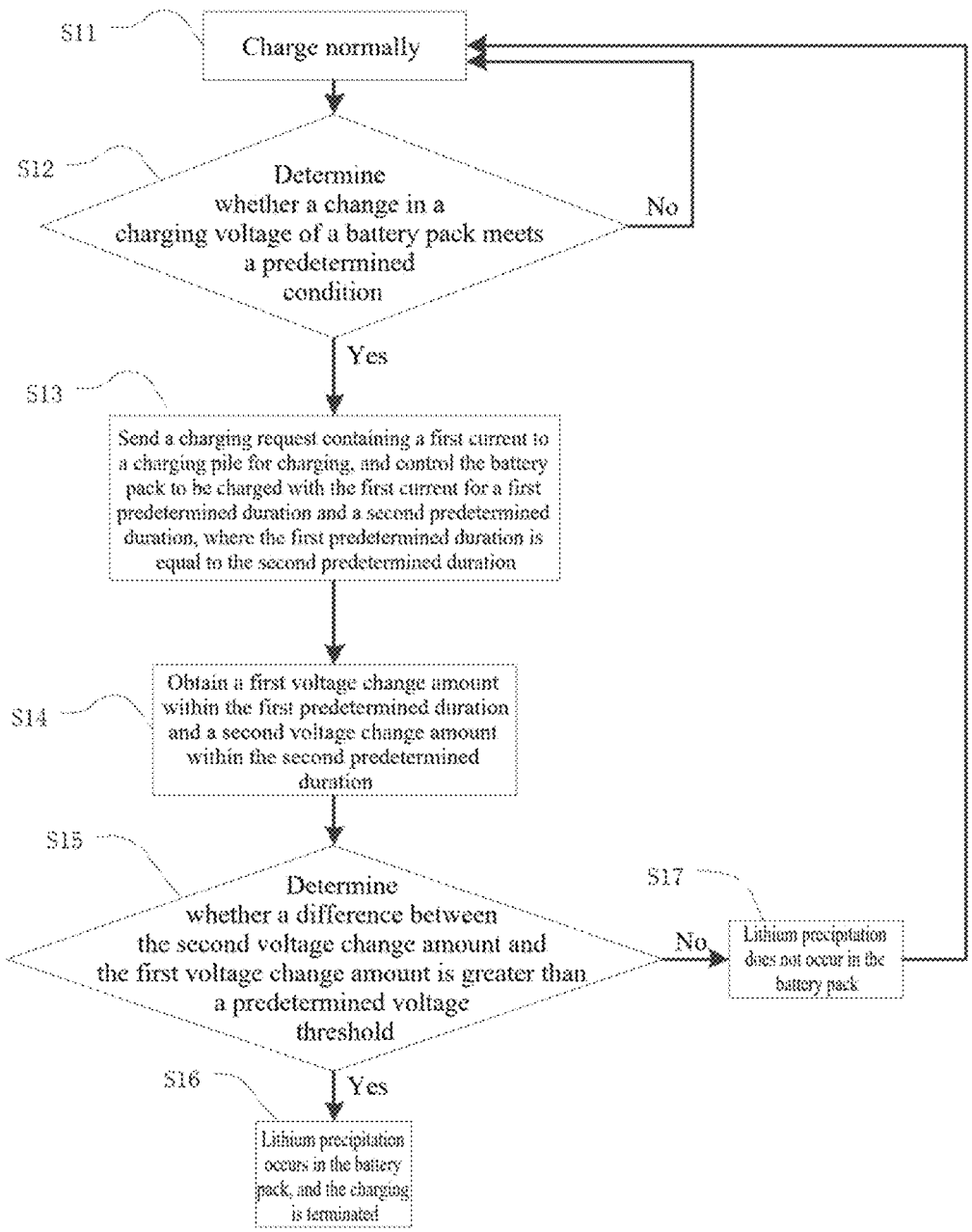
FIG. 1 is a flowchart of a lithium precipitation detection method for a battery pack according to some embodiments of the present application.

Embodiments of the technical solutions of the present application will be described in detail below with reference to the accompanying drawings. The following embodiments are merely intended to more clearly illustrate the technical solutions of the present application, so they merely serve as examples, but are not intended to limit the scope of protection of the present application.

Unless otherwise defined, all technical and scientific terms used herein have the same meanings as those commonly understood by those skilled in the art to which the present application belongs. The terms used herein are merely for the purpose of describing specific embodiments, but are not intended to limit the present application. The terms "comprising" and "having" and any variations thereof in the description and the claims of the present application as well as the brief description of the accompanying drawings described above are intended to cover non-exclusive inclusion.

In the description of the embodiments of the present application, the technical terms "first", "second", etc. are merely used for distinguishing different objects, and are not to be construed as indicating or implying relative importance or implicitly indicating the number, particular order or primary-secondary relationship of the indicated technical features. In the description of the embodiments of the present application, the phrase "a plurality of" means two or more, unless otherwise explicitly and specifically defined.

The phrase "embodiment" mentioned herein means that the specific features, structures, or characteristics described in conjunction with the embodiment can be encompassed in at least one embodiment of the present application. The phrase at various locations in the description does not necessarily refer to the same embodiment, or an independent or alternative embodiment exclusive of another embodiment. Those skilled in the art understand explicitly or implicitly that the embodiment described herein may be combined with another embodiment.

If steps are stated in sequence in the description, this does not necessarily mean an embodiment or aspect is limited to the stated sequence. Conversely, it may be envisaged that the steps are performed in a different sequence or in parallel to each other, unless a next step is established on a current step, which necessarily requires the current step to be performed and then the next step (this will be clear in specific embodiments). Therefore, the stated sequence may be a preferred embodiment.

At present, from the perspective of the development of the market situation, traction batteries are used more and more widely. The traction batteries are not only used in energy storage power systems such as hydroelectric power plants, thermal power plants, wind power plants and solar power plants, but also widely used in electric transportation means such as electric bicycles, electric motorcycles, and electric vehicles and in many fields such as military equipment and aerospace. With the continuous expansion of the application field of traction batteries, the market demand for the traction batteries is also expanding. In the wide application of traction batteries, especially lithium-ion batteries, people have increasingly high requirements for a charging speed of batteries.

The inventors noticed that although fast charging can significantly shorten a charging duration, relieve range anxiety, and meet people's requirements for a charging speed of batteries, it causes a certain acceleration effect on capacity and power degradation of the batteries, which further leads to significant lithium precipitation in the batteries. When some abnormalities occur in a battery during a charging process, lithium ions cannot be intercalated into a negative electrode after being deintercalated from a positive electrode, but can only be precipitated on a surface of the negative electrode, forming a layer of gray material. This phenomenon is called lithium precipitation. Lithium precipitation is a degradation phenomenon in lithium-ion batteries. Lithium precipitation may not only reduce the performance and the cycle life of the battery, but also limit the fast charging capacity of the battery, and when precipitated lithium dendrites pierce a separator and cause a short circuit in the battery, disastrous consequences such as combustion and explosion may be caused.

In view of these severe consequences caused by lithium precipitation, there is an urgent need for a lithium precipitation detection method for a battery pack, that can detect lithium precipitation in the battery pack in a timely, simple, and efficient manner without substantially affecting the charging efficiency of the battery pack, so that further prevention measures can be taken.

The applicant has found through research that whether lithium precipitation occurs in the battery pack may be detected within a specific time period during a charging process of the battery pack, and when lithium precipitation occurs in the battery pack, the charging can be terminated, thereby avoiding severe consequences caused by lithium precipitation. Specifically, the applicant has found through research that whether lithium precipitation occurs in the battery pack may be detected when a change in a charging voltage of the battery pack meets a predetermined condition during a normal charging process of the battery pack. For example, whether lithium precipitation occurs in the battery pack is detected when there is a rapid change in a charging voltage of the battery pack during a normal charging process of the battery pack. In this way, timely and efficient detection can be implemented. However, during the normal charging process of the battery pack, using a conventional method to detect whether lithium precipitation occurs in the battery pack may interrupt the normal charging process of the battery pack, the detection efficiency of the method is low, and the charging efficiency of the battery pack may be affected.

Based on the above considerations, the inventors have designed, through in-depth research, a lithium precipitation detection method for a battery pack, where the battery pack includes a battery management module, and the lithium precipitation detection method includes: sending, when the battery management module determines that a change in a charging voltage of the battery pack meets a predetermined condition, a charging request containing a first current to a charging pile for charging, and controlling the battery pack to be charged with the first current for a first predetermined duration and a second predetermined duration, where the first predetermined duration is equal to the second predetermined duration; obtaining, by the battery management module, a first voltage change amount within the first predetermined duration and a second voltage change amount within the second predetermined duration; and determining, when the battery management module determines that a difference between the second voltage change amount and the first voltage change amount is greater than a predetermined voltage threshold, that lithium precipitation occurs in the battery pack.

In the lithium precipitation detection method, when the change in the charging voltage of the battery pack meets the predetermined condition, for example, there is a rapid change in the charging voltage of the battery pack during a normal charging process of the battery pack, the charging with the first current lasts for the two equal predetermined durations, the voltage change amount within one of the two predetermined durations is compared with that within the other, and if the voltage change amount is greater than a specific value, it indicates that lithium precipitation occurs in the battery pack. The inventors have found through in-depth research that when there is a rapid change in the charging voltage of the battery pack during the normal charging process of the battery pack, if the battery pack continues to be charged while lithium precipitation occurs in the battery pack, a part of precipitated lithium ions will re-enter an electrolyte, and then re-enter a negative electrode material of the battery pack, resulting in a significant increase in the charging voltage of the battery pack, and the lithium precipitation in the battery pack can be detected more easily at this time in a timely and efficient manner. In addition, the first current is selected within a range of a small current such as 0.1 A-10 A, or a predetermined duration for charging with the small current is selected within a range of 1 minute to 15 minutes. In this way, lithium precipitation in the battery pack can be detected in a timely, simple, and efficient manner without interrupting the normal charging process of the battery pack.

The battery pack involved in this embodiment of the present application may be used in, but not limited to, power consuming apparatuses such as vehicles, ships, or aircrafts. The battery pack in the present application may be used to form a power supply system of the power consuming apparatus, which is conducive to detecting lithium precipitation in the battery pack in a timely, simple, and efficient manner without substantially affecting the charging efficiency of the battery pack, so that further prevention measures can be taken.

An embodiment of the present application provides a power consuming apparatus using a battery pack as a power supply. The power consuming apparatus may be, but not limited to, a mobile phone, a tablet, a notebook computer, an electric toy, an electric tool, an electromobile, an electric vehicle, a ship, a spacecraft, or the like. The electric toy may include a stationary or mobile electric toy, such as a game console, an electric vehicle toy, an electric ship toy, and an electric airplane toy. The spacecraft may include an airplane, a rocket, a space shuttle, a spaceship, etc.

FIG. 1 is a flowchart of a lithium precipitation detection method for a battery pack according to some embodiments of the present application. The battery pack includes a battery management module, and the lithium precipitation detection method is performed by the battery management module. The battery pack includes a plurality of batteries. The battery management module is the intelligent center of the battery pack. Its core functions are to protect the battery pack, collect battery pack data, evaluate a status of the battery pack, perform charging and discharging management, perform high-voltage control, etc.

The lithium precipitation detection method for a battery pack in FIG. 1 starts with step S11. In step S11, the battery management module controls the battery pack to be charged normally. Those skilled in the art should understand that the lithium precipitation detection method of the present Disclosure may include step S11, or may be implemented independently of step S11. In step S12, the battery management module determines whether a change in a charging voltage of the battery pack meets a predetermined condition. If the battery management module determines that the change in the charging voltage of the battery pack does not meet the predetermined condition, step S11 is performed, that is, the battery pack continues to be controlled for being charged normally. If the battery management module determines that the change in the charging voltage of the battery pack meets the predetermined condition, step S13 is performed, that is, a charging request containing a first current is sent to a charging pile for charging, and the battery pack is controlled for being charged with the first current for a first predetermined duration and a second predetermined duration, where the first predetermined duration is equal to the second predetermined duration; step S14 is performed, that is, the battery management module obtains a first voltage change amount within the first predetermined duration and a second voltage change amount within the second predetermined duration; and then step S15 is performed, that is, the battery management module determines whether a difference between the second voltage change amount and the first voltage change amount is greater than a predetermined voltage threshold. If the battery management module determines that the difference between the second voltage change amount and the first voltage change amount is greater than the predetermined voltage threshold, step S16 is performed, that is, the battery management module determines that lithium precipitation occurs in the battery pack, and the charging is terminated. If the battery management module determines that the difference between the second voltage change amount and the first voltage change amount is not greater than the predetermined voltage threshold, step S17 is performed, that is, the battery management module determines that lithium precipitation does not occur in the battery pack, and step S11 is performed to continue with the normal charging.

The "predetermined condition" in the present application especially refers to a situation that there is a rapid change in the charging voltage of the battery pack during the normal charging process of the battery pack. When there is a rapid change in the charging voltage of the battery pack during the normal charging process of the battery pack, if the battery pack continues to be charged while lithium precipitation occurs in the battery pack, a part of precipitated lithium ions will re-enter an electrolyte, and then re-enter a negative electrode material of the battery pack, resulting in a significant increase in the charging voltage of the battery pack, and the lithium precipitation in the battery pack can be detected more easily at this time in a timely and efficient manner. "Rapid change" in the present application refers to a time period with a relatively large slope or curvature on a charging voltage curve of the battery pack.

"First current" in the present application especially refers to a small current such as a current within a range of 0.1 A-10 A. Charging with a small current can enable lithium precipitation in the battery pack to be detected in a timely, simple, and efficient manner, only when the charging continues for a relatively short predetermined duration, without interrupting the normal charging process of the battery pack.

Figure 2:
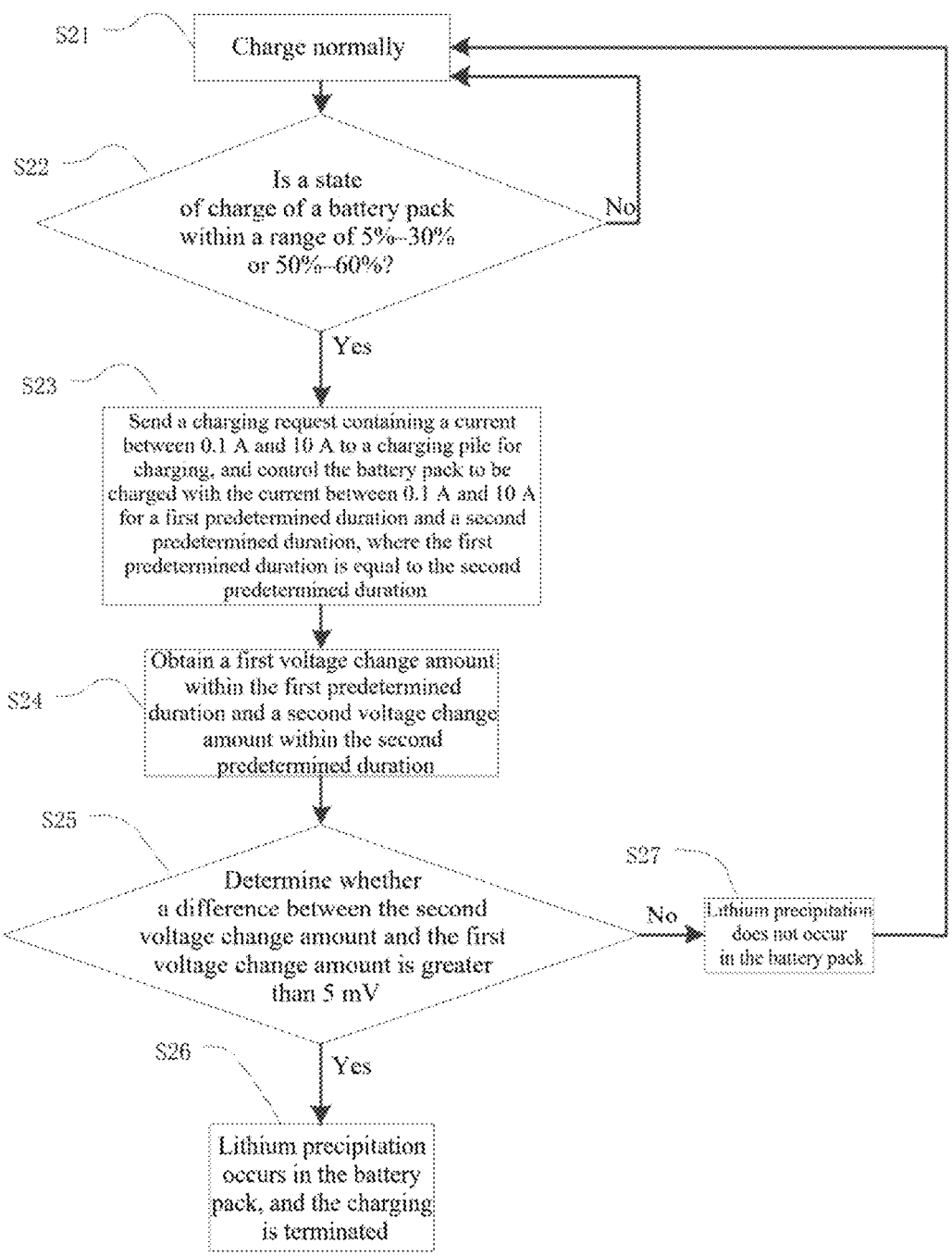
FIG. 2 is a flowchart of a lithium precipitation detection method for a battery pack according to some other embodiments of the present application.

FIG. 2 is a flowchart of a lithium precipitation detection method for a battery pack according to some other embodiments of the present application. Similar to the description given with reference to FIG. 1, the battery pack includes a battery management module, and the lithium precipitation detection method is performed by the battery management module.

The lithium precipitation detection method in FIG. 2 is a preferred solution implemented for a battery pack whose negative electrode material is graphite. It should be understood that the lithium precipitation detection method in FIG. 2, when amended adaptively, may also be applied to battery packs whose negative electrode material is soft carbon (for example, coke), hard carbon, nitride, tin oxide, tin alloy, anode nanomaterials, etc.

The lithium precipitation detection method for a battery pack in FIG. 2 starts with step S21. In step S21, the battery management module controls the battery pack to be charged normally.

In step S22, the battery management module determines whether a state of charge of the battery pack is within a range of 5%-30% or 50%-60%, In the present application, the state of charge (SOC) of the battery pack refers to a ratio of an amount of electricity available in the battery pack to a nominal capacity (an amount of electricity that can be outputted from the fully charged battery pack until the end of discharge) of the battery pack, and reflects a state of charge of the battery pack. The battery management module can monitor a state of charge of the battery pack, and can control a working state of the battery pack based on the state of charge of the battery pack.

Figure 3:
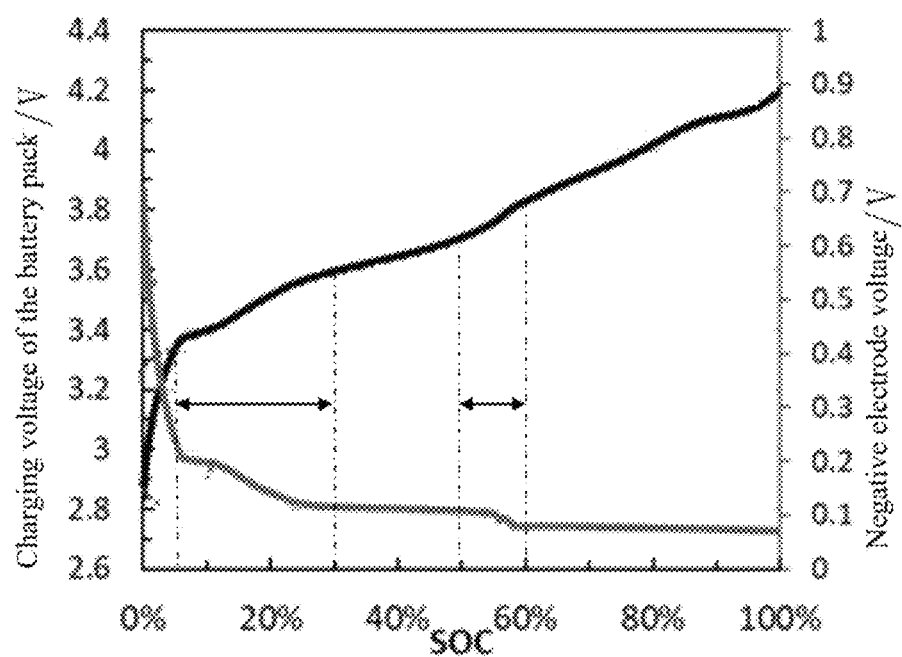
FIG. 3 is a curve graph of a relationship between a battery pack voltage, a negative electrode voltage, and a state of charge of a battery pack in a lithium precipitation detection method for a battery pack according to some embodiments of the present application.

Steep S22 will be described below with reference to FIG. 3. FIG. 3 is a curve graph of a relationship between a charging voltage of a battery pack, a negative electrode voltage of the battery pack (herein referred to as a negative electrode voltage of graphite because its negative electrode material is graphite), and a state of charge in a lithium precipitation detection method for a battery pack according to some embodiments of the present application.

As shown in FIG. 3, the upper curve represents the charging voltage of the battery pack, and the lower curve represents the negative electrode voltage of the battery pack. It can be seen from FIG. 3 that a slope or curvature of the charging voltage curve of the battery pack within a specific time period is larger than those in the other time periods, and this time period is a time period with a rapid change in the charging voltage of the battery pack. The inventors have found through in-depth research that when the state of charge of the battery pack is within the range of 5%-30% or 50%-60%, a negative electrode voltage of the battery pack significantly decreases, while a battery voltage of the battery pack significantly increases, and whether lithium precipitation occurs in the battery pack can be detected more easily at this time in a timely and efficient manner.

The curve graph of the relationship shown in FIG. 3 is for a battery pack whose negative electrode material is graphite. In addition to the battery pack whose negative electrode material is graphite, the lithium precipitation detection method of the present application may also be applied to battery packs including, but not limited to, battery packs whose negative electrode material is soft carbon (for example, coke), hard carbon, nitride, tin oxide, tin alloy, an anode nanomaterial, etc. For battery packs whose negative electrode material is soft carbon (for example, coke), hard carbon, nitride, tin oxide, tin alloy, an anode nanomaterial, etc., when step S22 is performed, the battery management module needs to determine whether the battery pack is within the time period with a rapid change in the charging voltage of the battery pack, or needs to determine whether the state of charge of the battery pack is within a range corresponding to the time period with a rapid change in the charging voltage of the battery pack. As mentioned above, the battery management module needs to determine whether the battery pack is within the time period with a relatively large slope or curvature on the charging voltage curve of the battery pack, so as to determine, based on this, whether it is in an optimal time period for performing the lithium precipitation detection method of the present application.

Referring to FIG. 2 again, if the battery management module determines that the state of charge of the battery pack is not within the range of 5%-30% or 50%-60%, step S21 is performed, that is, the battery pack continues to be controlled for being charged normally.

If the battery management module determines that the state of charge of the battery pack is within the range of 5%-30% or 50%-60%, the battery management module determines that a current time period is a time period within which whether lithium precipitation occurs in the battery pack can be detected more easily, and step S23 is performed, that is, a charging request containing a current between 0.1 A and 10 A is sent to a charging pile for charging, and the battery pack is controlled for being charged with the current between 0.1 A and 10 A for a first predetermined duration and a second predetermined duration, where the first predetermined duration is equal to the second predetermined duration.

It can be seen from FIG. 3 that when the state of charge of the battery pack is within the range of 5%-30% or 50%-60%, there is a rapid change in the charging voltage of the battery pack. If the battery pack continues to be charged while lithium precipitation occurs in the battery pack, a part of precipitated lithium ions will re-enter an electrolyte, and then re-enter a graphite negative electrode material of the battery pack, resulting in a significant increase in the charging voltage of the battery pack, and the lithium precipitation in the battery pack can be detected more easily at this time in a timely and efficient manner.

In order not to interrupt the normal charging process of the battery pack or in order not to affect the charging efficiency of the battery pack, the first predetermined duration and the second predetermined duration may optionally range from 1 minute to 15 minutes. In this way, if the battery pack is fully charged within 60 minutes originally, after the lithium precipitation detection method is implemented, it is fully charged within 61 minutes to 75 minutes, and therefore the normal charging process of the battery pack is substantially not interrupted and the charging efficiency of the battery pack is not affected. However, it should be understood that if the normal charging process of the battery pack needs to be interrupted, the first predetermined duration and the second predetermined duration may alternatively be another value.

In addition, in the lithium precipitation detection method of the present application, the charging current of the battery pack within the first predetermined duration is the same as that within the second predetermined duration. For example, the battery management module controls the battery pack to be charged with a current of 0.5 A for the first predetermined duration of five minutes, and then charged with a current of 0.5 A for the second predetermined duration of five minutes.

The battery management module performs step S24, that is, obtains a first voltage change amount within the first predetermined duration and a second voltage change amount within the second predetermined duration; and then performs step S25, that is, the battery management module determines whether a difference between the second voltage change amount and the first voltage change amount is greater than 5 mV.

If the battery management module determines that the difference between the second voltage change amount and the first voltage change amount is greater than 5 mV, step S26 is performed, that is, the battery management module determines that lithium precipitation occurs in the battery pack, and the charging is terminated. If the battery management module determines that the difference between the second voltage change amount and the first voltage change amount is not greater than 5 mV, step S27 is performed, that is, the battery management module determines that lithium precipitation does not occur in the battery pack, and step S21 is performed to continue with the normal charging.

The inventors of the present application have found through in-depth research that 5 mV is an optimal value for determining whether lithium precipitation occurs in the battery pack, and lithium precipitation in the battery pack can be reliably detected based on this.

For example, the first voltage change amount is 3.372 V, and the second voltage change amount is 3.375 V. The difference between the second voltage change amount and the first voltage change amount is not greater than 5 mV. Through the lithium precipitation detection method of the present application, it is determined that lithium precipitation does not occur in the battery pack. Through actual detection, there is indeed no lithium precipitation occurring in the battery pack. For another example, the first voltage change amount is 3.372. V, and the second voltage change amount is 3.390 V. The difference between the second voltage change amount and the first voltage change amount is greater than 5 mV. Through the lithium precipitation detection method of the present application, it is determined that lithium precipitation occurs in the battery pack. Through actual detection, there is indeed lithium precipitation occurring in the battery pack.

According to the method of the present application, lithium precipitation can be detected by introducing a small charging current during the normal charging process of the battery pack, so that the detection efficiency is high, and the charging efficiency of the battery pack is substantially not affected. Therefore, the method is applicable to all commercial lithium-ion batteries.

Finally, it should be noted that the above embodiments are merely used for illustrating rather than limiting the technical solutions of the present application. Although the present application has been illustrated in detail with reference to the foregoing embodiments, it should be understood by those of ordinary skill in the art that the technical solutions described in the foregoing embodiments may still be modified, or some or all of the technical features thereof may be equivalently substituted; and such modifications or substitutions do not make the essence of the corresponding technical solution depart from the scope of the technical solutions of the embodiments of the present application, and should fall within the scope of the claims and the description of the present application. In particular, the technical features mentioned in the embodiments can be combined in any manner, provided that there is no structural conflict. The present application is not limited to the specific embodiments disclosed herein but includes all the technical solutions that fall within the scope of the claims.

The invention claimed is:

1. A lithium precipitation detection method for a battery pack, wherein the battery pack comprises a battery management module, and the lithium precipitation detection method comprises:

sending, when the battery management module determines that a change in a charging voltage of the battery pack meets a predetermined condition, a charging request containing a first current to a charging pile for charging, and controlling the battery pack to be charged with the first current for a first predetermined duration and a second predetermined duration, wherein the first predetermined duration is equal to the second predetermined duration;

obtaining, by the battery management module, a first voltage change amount within the first predetermined duration and a second voltage change amount within the second predetermined duration; and determining, when the battery management module determines that a difference between the second voltage change amount and the first voltage change amount is greater than a predetermined voltage threshold, that lithium precipitation occurs in the battery pack.

2. The lithium precipitation detection method according to claim 1, wherein the sending, when the battery management module determines that a change in a charging voltage of the battery pack meets a predetermined condition, a charging request containing a first current to a charging pile for charging, and controlling the battery pack to be charged with the first current for a first predetermined duration and a second predetermined duration comprises:

when the battery management module determines that a state of charge of the battery pack is within a range of 5%-30% or 50%-60%, sending the charging request containing the first current to the charging pile for charging, and controlling the battery pack to be charged with the first current for the first predetermined duration and the second predetermined duration.

3. The lithium precipitation detection method according to claim 1, wherein the sending, when the battery management module determines that a change in a charging voltage of the battery pack meets a predetermined condition, a charging request containing a first current to a charging pile for charging, and controlling the battery pack to be charged with the first current for a first predetermined duration and a second predetermined duration comprises:

when the battery management module determines that a state of charge of the battery pack meets a predetermined condition, sending a charging request containing a current between 0.1 A and 10 A to the charging pile for charging, and controlling the battery pack to be charged with the current between 0.1 A and 10 A for the first predetermined duration and the second predetermined duration.

4. The lithium precipitation detection method according to claim 1, wherein the obtaining, by the battery management module, a first voltage change amount within the first predetermined duration and a second voltage change amount within the second predetermined duration comprises:

obtaining, by the battery management module, the first voltage change amount within the first predetermined duration and the second voltage change amount within the second predetermined duration, wherein a value of the first predetermined duration and the second predetermined duration ranges from 1 minute to 15 minutes.

5. The lithium precipitation detection method according to claim 1, wherein the determining, when the battery management module determines that a difference between the second voltage change amount and the first voltage change amount is greater than a predetermined voltage threshold, that lithium precipitation occurs in the battery pack comprises:

when the battery management module determines that the difference between the second voltage change amount and the first voltage change amount is greater than 5 mV, determining that lithium precipitation occurs in the battery pack.

6. A non-transitory computer-readable storage medium storing computer instructions, wherein when the computer instructions are executed, the lithium precipitation detection method according to claim 1 is performed.

7. A power consuming apparatus, wherein the power consuming apparatus comprises a battery pack, and the battery pack is configured to perform the lithium precipitation detection method according to claim 1.

* * * * *